United States Patent
Han et al.

(10) Patent No.: US 11,380,633 B2
(45) Date of Patent: Jul. 5, 2022

(54) RADIO FREQUENCY MODULE

(71) Applicant: Samsung Electro-Mechanics Co., Ltd., Suwon-si (KR)

(72) Inventors: Myeong Woo Han, Suwon-si (KR); Young Sik Hur, Suwon-si (KR); Won Gi Kim, Suwon-si (KR); Soo Ki Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 252 days.

(21) Appl. No.: 15/930,734

(22) Filed: May 13, 2020

(65) Prior Publication Data

US 2021/0257318 A1    Aug. 19, 2021

(30) Foreign Application Priority Data

Feb. 19, 2020    (KR) .................. 10-2020-0020068

(51) Int. Cl.
| | |
|---|---|
| *H01L 23/34* | (2006.01) |
| *H01L 23/66* | (2006.01) |
| *H01L 23/498* | (2006.01) |
| *H01Q 1/38* | (2006.01) |
| *H01Q 21/00* | (2006.01) |

(Continued)

(52) U.S. Cl.
CPC ........ *H01L 23/66* (2013.01); *H01L 23/49827* (2013.01); *H01L 24/13* (2013.01); *H01L 24/73* (2013.01); *H01Q 1/2283* (2013.01); *H01Q 1/38* (2013.01); *H01Q 9/045* (2013.01); *H01Q 21/0006* (2013.01); *H01Q 21/065* (2013.01); H01L 2223/6677 (2013.01); H01L 2224/73253 (2013.01); H01L 2924/1421 (2013.01)

(58) Field of Classification Search
CPC ............. H01L 23/66; H01L 2223/6677; H01L 2924/1421; H01Q 1/2283; H01Q 1/38; H01Q 21/065
USPC ........................................................ 257/728
See application file for complete search history.

(56) References Cited

U.S. PATENT DOCUMENTS 6,154,176 A * 11/2000 Fathy ................... H01Q 9/0414
                                                             343/846
10,938,091 B1 * 3/2021 Cho ..................... H01Q 9/0407
(Continued)

FOREIGN PATENT DOCUMENTS

KR   10-2019-0123194 A   10/2019
WO   WO 2017/047396 A1   3/2017

*Primary Examiner* — Nitin Parekh
(74) *Attorney, Agent, or Firm* — NSIP Law

(57) ABSTRACT

A radio frequency module includes a radio frequency integrated circuit (RFIC) to input or output a base signal and a radio frequency (RF) signal having a higher frequency than the base signal, a wiring via extending upward from the RFIC and a feed line electrically connected to the wiring via to provide a transmission path of the RF signal, a second ground layer surrounding the feed line, a first ground layer spaced above the second ground layer, a third ground layer between the second ground layer and the RFIC, a feed-line insulating layer disposed between the first and third ground layers, an IC wiring layer between the third ground layer and the RFIC, electrically connected to the RFIC, and providing a transmission path of the base signal, and an IC insulating layer between the third ground layer and the RFIC, having a higher dielectric constant than the feed-line insulating layer.

20 Claims, 14 Drawing Sheets

(51) Int. Cl.
  *H01Q 21/06* (2006.01)
  *H01L 23/00* (2006.01)
  *H01Q 9/04* (2006.01)
  *H01Q 1/22* (2006.01)

(56) References Cited

U.S. PATENT DOCUMENTS

| | | |
|---|---|---|
| 2018/0205155 A1 | 7/2018 | Mizunuma et al. |
| 2019/0326674 A1 | 10/2019 | Kang et al. |
| 2020/0112081 A1* | 4/2020 | Kim .................... H01Q 21/065 |
| 2020/0194893 A1* | 6/2020 | Im ...................... H01L 23/5386 |
| 2020/0313279 A1* | 10/2020 | Kim ........................ H01Q 1/38 |
| 2020/0395675 A1* | 12/2020 | Han ........................ H01Q 5/35 |
| 2020/0403321 A1* | 12/2020 | Kang .................... H01Q 9/045 |

* cited by examiner

RADIO FREQUENCY MODULE

CROSS-REFERENCE TO RELATED APPLICATIONS

This application claims the benefit under 35 USC 119(a) of Korean Patent Application No. 10-2020-0020068 filed on Feb. 19, 2020, in the Korean Intellectual Property Office, the entire disclosure of which is incorporated herein by reference for all purposes.

BACKGROUND

1. Field

The present disclosure relates to a radio frequency module.

2. Description of the Background

Mobile communications data traffic has increased on an annual basis. Various techniques have been actively developed to support rapidly increasing data in wireless networks in real time. For example, conversion of Internet of Things (IoT)-based data into content, augmented reality (AR), virtual reality (VR), live VR/AR linked with social network system (SNS), an automatic driving function, applications such as a sync view (transmission of real-time images from a user's viewpoint using a compact camera), and the like, may require communications (e.g., 5th generation (5G) communications, mmWave communications, and the like) which support the rapid transmission and reception of large volumes of data.

Accordingly, there has been a large amount of research on mmWave communications including 5th generation (5G), and research into the commercialization and standardization of an antenna apparatus for implementing such communications has been increasingly conducted.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency module includes a radio frequency integrated circuit (RFIC) configured to input or output a base signal and a radio frequency (RF) signal having a frequency higher than a frequency of the base signal, a wiring via extending from the RFIC in an upward direction and configured to provide a transmission path of the RF signal, a feed line electrically connected to the wiring via and configured to provide the transmission path of the RF signal, a second ground layer surrounding the feed line, a first ground layer spaced apart from the second ground layer in an upward direction, a third ground layer disposed between the second ground layer and the RFIC, a feed-line insulating layer disposed between the first and third ground layers, at least one IC wiring layer disposed between the third ground layer and the RFIC, electrically connected to the RFIC, and having at least one portion configured to provide a transmission path of the base signal, and at least one IC insulating layer disposed between the third ground layer and the RFIC, wherein a dielectric constant of the at least one IC insulating layer is higher than a dielectric constant of the feed-line insulating layer.

The at least one IC wiring layer may further include a power line configured to provide a transfer path of power for the RFIC. The at least one portion may include a base signal line configured to provide the transmission path of the base signal.

The at least one IC wiring layer may further include a fourth ground layer electrically connected to the RFIC.

The radio frequency module may further include a first patch antenna pattern spaced apart from the first ground layer in an upward direction, a feed via electrically connected to the feed line and configured to provide a feeding path with respect to the first patch antenna pattern, and a first antenna insulating layer disposed between the first ground layer and the first patch antenna pattern.

A dielectric constant of the feed-line insulating layer may be lower than a dielectric constant of the first antenna insulating layer.

The radio frequency module may further include a second patch antenna pattern spaced apart from the first patch antenna pattern in an upward direction, and a second antenna insulating layer disposed between the first and second patch antenna patterns.

A dielectric constant of the first antenna insulating layer may be higher than a dielectric constant of the feed-line insulating layer, and may be higher than a dielectric constant of the second antenna insulating layer.

The radio frequency module may further include an antenna insulating adhesive layer in contact with the first and second antenna insulating layers between the first and second antenna insulating layers.

The radio frequency module may further include an insulating adhesive layer in contact with the at least one IC insulating layer and the feed-line insulating layer between the at least one IC insulating layer and the feed-line insulating layer.

An electronic device may include a plurality of different edges, the radio frequency module disposed adjacent to an edge of the plurality of edges, a communications modem, and a baseband integrated circuit (IC) configured to generate the base signal and transfer the base signal input to and output from the baseband IC to the radio frequency module.

The electronic device may be a smart phone, a personal digital assistant, a digital video camera, a digital still camera, a network system, a computer, a monitor, a tablet personal computer (PC), a laptop PC, a netbook PC, a television, a video game, a smart watch, or an automotive component.

In another general aspect, a radio frequency module includes a radio frequency integrated circuit (RFIC) configured to input or output a base signal and a radio frequency (RF) signal having a frequency higher than a frequency of the base signal, a wiring via extending from the RFIC in an upward direction and configured to provide a transmission path of the RF signal, a feed line electrically connected to the wiring via and configured to provide the transmission path of the RF signal, a second ground layer surrounding the feed line, a first ground layer spaced apart from the second ground layer in an upward direction, a third ground layer disposed between the second ground layer and the RFIC, a feed-line insulating layer disposed between the first and third ground layers, at least one IC wiring layer disposed between the third ground layer and the RFIC, electrically connected to the RFIC, and having at least one portion configured to provide a transmission path of the base signal, at least one IC insulating layer disposed between the third ground layer and the RFIC, and one or more of a first insulating adhesive layer in contact with a lower surface of the feed-line insulating layer and a second insulating adhesive layer in contact with an upper surface of the feed-line insulating layer.

The first insulating adhesive layer may be disposed in contact with the at least one IC insulating layer and the feed-line insulating layer between the at least one IC insulating layer and the feed-line insulating layer.

The radio frequency module may further include a first patch antenna pattern spaced apart from the first ground layer in an upward direction, a feed via electrically connected to the feed line and configured to provide a feeding path with respect to the first patch antenna pattern, and a first antenna insulating layer disposed between the first ground layer and the first patch antenna pattern, wherein the second insulating adhesive layer may be disposed in contact with the first antenna insulating layer and the feed-line insulating layer between the first antenna insulating layer and the feed-line insulating layer.

The radio frequency module may further include a second patch antenna pattern spaced apart from the first patch antenna pattern in an upward direction, a second antenna insulating layer disposed between the first and second patch antenna patterns, and an antenna insulating adhesive layer in contact with the first and second antenna insulating layers between the first and second antenna insulating layers.

The second insulating adhesive layer may be configured to provide a dispositional space free of solder having a melting point lower than a melting point of the feed via between the first antenna insulating layer and the feed-line insulating layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
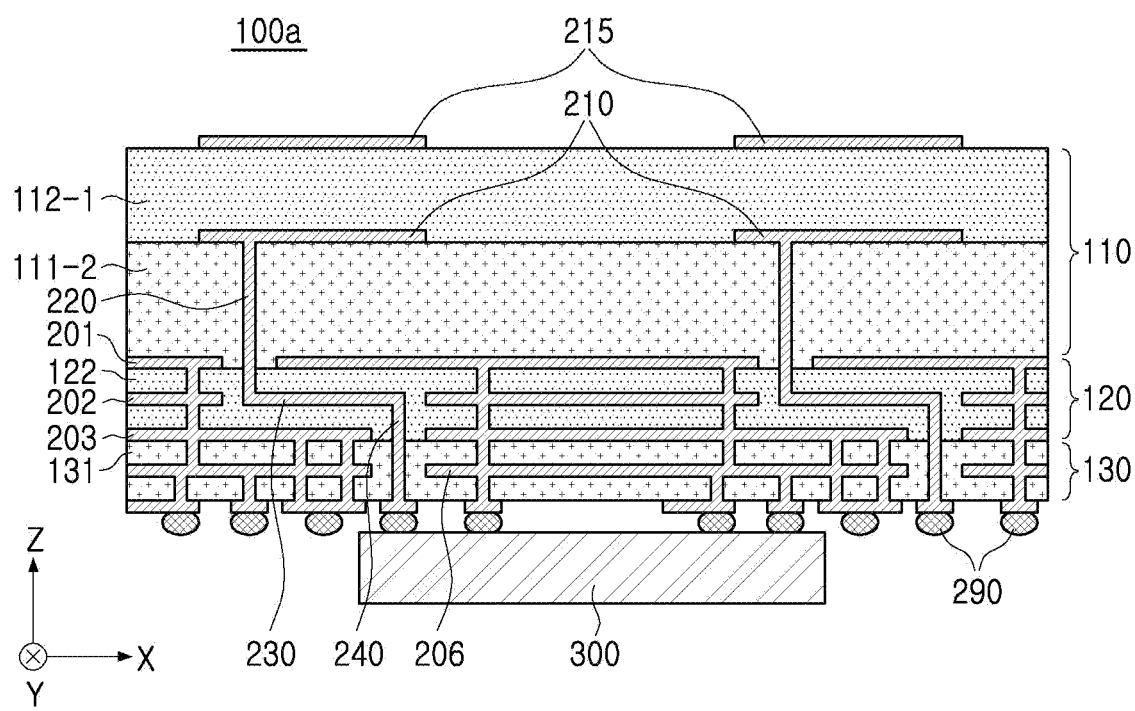
FIGS. 1A to 1E are lateral views illustrating a radio frequency module according to one or more example embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

An aspect of the present disclosure is to provide a radio frequency module.

FIGS. 1A to 1E are lateral views illustrating a radio frequency module according to one or more example embodiments.

Referring to FIG. 1A, a radio frequency module 100a in an example embodiment may include a feeding unit 120, an IC support unit 130, and a radio frequency integrated circuit (RFIC) 300, and in example embodiments, the radio frequency module 100a may further include an antenna unit 110.

Referring to FIG. 1A, the radio frequency module 100a in the example embodiment may include an RFIC 300, a wiring via 240, a feed line 230, a second ground layer 202, a first ground layer 201, a third ground layer 203, a feed-line insulating layer 122, at least one integrated circuit (IC) wiring layer 206, and at least one IC insulating layer 131.

The RFIC 300 may input and/or output a base signal and a radio frequency (RF) signal having a frequency higher than a frequency of the base signal.

For example, the RFIC 300 may generate an RF signal to be transmitted by processing (e.g., amplification, frequency conversion, filtering, a phase control, or the like) the base signal, or may generate a base signal by processing a received RF signal, and may include a semiconductor circuit and/or an impedance element.

For example, the base signal may be an intermediate frequency (IF) signal or a baseband signal having a frequency lower than a frequency of the RF signal. The base signal may be input from an external entity (e.g., a base substrate, a baseband circuit, a communications module) through a portion of a plurality of electrical connector structures 290 disposed on a lower surface of the IC support unit 130 and may be transferred to the RFIC 300 through the IC support unit 130, and may be transferred from the RFIC 300 to an external entity through a portion of the plurality of electrical connector structures 290.

The wiring via 240 may extend from the RFIC 300 in an upward direction (e.g., +z direction) and may provide a transmission path of the RF signal. The wiring via 240 may be configured to penetrate the IC support unit 130. For example, two or more wiring vias 240 may be provided.

The feed line 230 may be electrically connected to the wiring via 240 and may provide a transmission path of the RF signal. For example, two or more feed lines 230 may be provided.

For example, the feed line 230 in the feeding unit 120 may be disposed on an x-y plane, disposed perpendicularly to an extending direction (e.g., z direction) of the wiring via 240. The shorter the electrical length of the feed line 230, the more the transmission loss of the RF signal may decrease.

The second ground layer 202 may surround the feed line 230 in a horizontal direction (e.g., x direction and/or y direction). Accordingly, the second ground layer 202 may reduce electromagnetic interference affecting the RF signal while the RF signal passes through the feed line 230. For example, when a plurality of the feed lines 230 are provided, the second ground layer 202 may surround each of the plurality of feed lines 230.

The first ground layer 201 may be spaced apart from the second ground layer 202 in an upward direction (e.g., +z direction). The first ground layer 201 may shield electromagnetic interference from an electromagnetic interference element (e.g., an antenna) disposed above the feed line 230.

The third ground layer 203 may be disposed between the second ground layer 202 and the RFIC 300. The third ground layer 203 may shield electromagnetic interference from the RFIC 300, an electromagnetic interference element disposed below the feed line 230.

The feed-line insulating layer 122 may be disposed between the first and third ground layers 201 and 203. A dielectric constant of the feed-line insulating layer 122 may affect a wavelength of an RF signal passing through the feed-line insulating layer 122.

When a physical length of the feed-line insulating layer 122 is constant and a dielectric constant of the feed-line insulating layer 122 decreases, a wavelength of an RF signal passing through the feed-line insulating layer 122 may increase, and an electrical length of the feed line 230 may decrease. As transmission loss of an RF signal in the feed line 230 may occur by an electrical length unit, when an electrical length of the feed line 230 is relatively short, transmission loss of the RF signal may be reduced. Also, when a dielectric constant of the feed-line insulating layer 122 is relatively low, it may be highly likely that a dielectric tangent may be relatively low such that transmission loss of the RF signal in the feed line 230 may be further reduced.

The at least one IC wiring layer 206 may be disposed between the third ground layer 203 and the RFIC 300, may be electrically connected to the RFIC 300, and at least a portion of the at least one IC wiring layer 206 may provide a transmission path of the base signal.

The at least one IC wiring layer 206 may provide a transmission path of the base signal, and may also provide a conductive structure for improving performance of processing (e.g., amplification, frequency conversion, filtering, a phase control, or the like) performed by the RFIC 300.

For example, the at least one IC wiring layer 206 may provide a transfer path of power for the RFIC 300. For example, power may be generated by a switching operation of a DC-DC converter, and the switching operation may work as a noise element in the RFIC 300. The at least one IC wiring layer 206 may attenuate the noise element caused by the switching operation.

For example, the at least one IC wiring layer 206 may attenuate a noise element generated in a process of frequency conversion performed by the RFIC 300. The higher the effective size of the at least one IC wiring layer 206, the higher the performance of attenuating a noise element.

For example, the at least one IC wiring layer 206 may provide an electrical connection path with respect to an external passive element (e.g., a passive component mounted by the electrical connector structure 290) which may complement impedance used in amplification or filtering performed by the RFIC 300. The greater the effective size of the at least one IC wiring layer 206, the higher the performance of impedance provision quality (e.g., a difference between target impedance and actually provided impedance).

For example, the at least one IC wiring layer 206 may provide an electrical connection path for increasing compactness of the RFIC 300 to the RFIC 300. The greater the effective size of the at least one IC wiring layer 206, the more the compactness of the RFIC 300 may easily increase.

Thus, the greater the effective size of the at least one IC wiring layer 206, the more the overall RFIC support performance of the at least one IC wiring layer 206 may improve.

The at least one IC insulating layer 131 may be disposed between the third ground layer 203 and the RFIC 300. The at least one IC wiring layer 206 and the at least one IC insulating layer 131 may be alternately stacked in the IC support unit 130. For example, the IC support unit 130 may have a stack structure similar to a stack structure of a printed circuit board.

The higher the total number of the at least one IC wiring layer 206 and the at least one IC insulating layer 131, the greater the effective size of the at least one IC wiring layer 206 may be. Accordingly, IC support performance of the at least one IC wiring layer 206 may improve.

The higher the total number of the at least one IC wiring layer 206 and the at least one IC insulating layer 131, the greater the thickness of the radio frequency module 100*a* may be in the z direction. Accordingly, an overall size of the radio frequency module 100*a* may increase, and a risk of warpage of layers may increase when the radio frequency module 100*a* is implemented.

In the radio frequency module 100*a* in the example embodiment, a dielectric constant of the at least one IC insulating layer 131 may be higher than a dielectric constant of the feed-line insulating layer 122.

The higher the dielectric constant of the at least one IC insulating layer 131, the greater the electromagnetic effective size of the at least one IC wiring layer 206 may be. Accordingly, the higher the dielectric constant of the at least one IC insulating layer 131, the more the effective size of a conductive structure for improving performance of processing performed by the RFIC 300 in the at least one IC insulating layer 131 may be such that the required number of the at least one IC insulating layer 131 may decrease.

Accordingly, the radio frequency module 100*a* in the example embodiment may secure overall RFIC support performance, may have a reduced size, and may decrease likelihood of warpage.

The antenna unit 110 may include a first patch antenna pattern 210, a second patch antenna pattern 215, a feed via 220, a first antenna insulating layer 111-2, and/or a second antenna insulating layer 112-1.

The first patch antenna pattern 210 may be spaced apart from the first ground layer 201 in an upward direction. The first patch antenna pattern 210 may have a resonant frequency corresponding to a frequency (e.g., 28 GHz) of an RF signal to remotely transmit and/or receive the RF signal in upward and downward directions (e.g., z direction).

The second patch antenna pattern 215 may be spaced apart from the first patch antenna pattern 210 in an upward direction, and may expand a resonant frequency of the first patch antenna pattern 210 and may increase a bandwidth of the first patch antenna pattern 210.

The feed via 220 may be electrically connected to the feed line 230 and may provide a feeding path with respect to the first patch antenna pattern 210.

The first antenna insulating layer 111-2 may be disposed between the first ground layer 201 and the first patch antenna pattern 210.

The second antenna insulating layer 112-1 may be disposed between the first and second patch antenna patterns 210 and 215.

A dielectric constant of the first antenna insulating layer 111-2 and a dielectric constant of the second antenna insulating layer 112-1 may affect antenna performance (e.g., a gain, or a bandwidth) of the antenna unit 110, and may also affect a size of the radio frequency module 100*a* or likelihood of warpage of the radio frequency module 100*a*.

Referring to FIGS. 1A, 1C, 1D, and 1E, a dielectric constant of the first antenna insulating layer 111-2 of each of radio frequency modules 100*a*, 100*c*, 100*d*, and 100*e* may be higher than a dielectric constant of the feed-line insulating layer 122.

Accordingly, a length of the feed via 220 may easily decrease, and a thickness of the first antenna insulating layer 111-2 may also easily decrease such that an overall size of each of the radio frequency modules 100*a*, 100*c*, 100*d*, and 100*e* may be reduced.

Figure 1B:
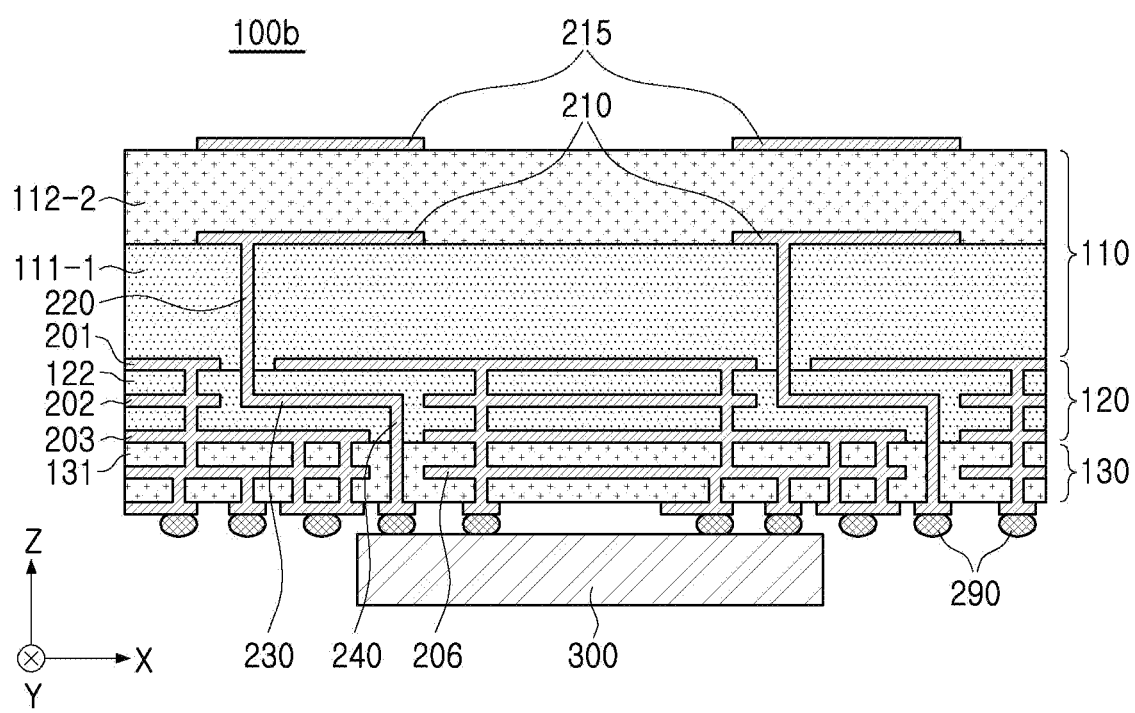

Referring to FIG. 1B, in example embodiments, a dielectric constant of a first antenna insulating layer 111-1 may be lower than a dielectric constant of the feed-line insulating layer 122.

Referring to FIG. 1A, a dielectric constant of the second antenna insulating layer 112-1 of the radio frequency module 100*a* may be lower than a dielectric constant of the first antenna insulating layer 111-2.

Accordingly, a radiation pattern of the first and second patch antenna patterns 210 and 215 may further be focused in the +z direction such that gain of the radio frequency module 100*a* may improve.

Also, the radio frequency module 100*a* in the example embodiment may have a structure in which a portion having a high dielectric constant and a portion having a low dielectric constant may be harmoniously distributed such that likelihood of warpage of layers may decrease.

Figure 1C:
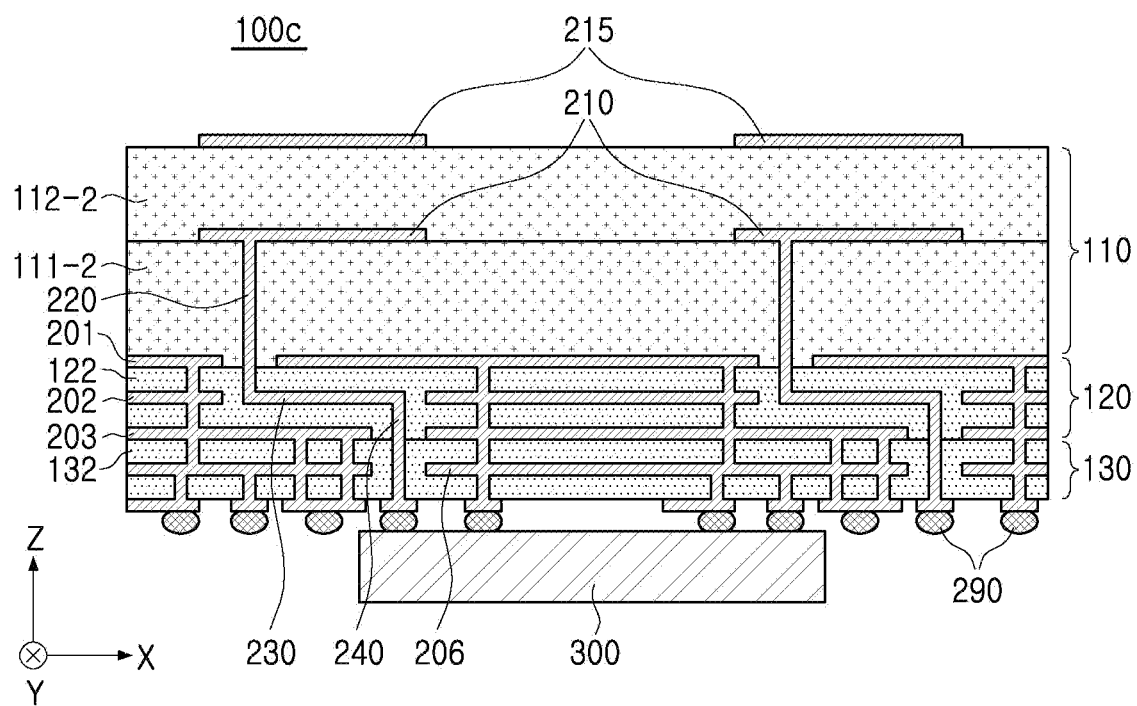
Figure 1D:
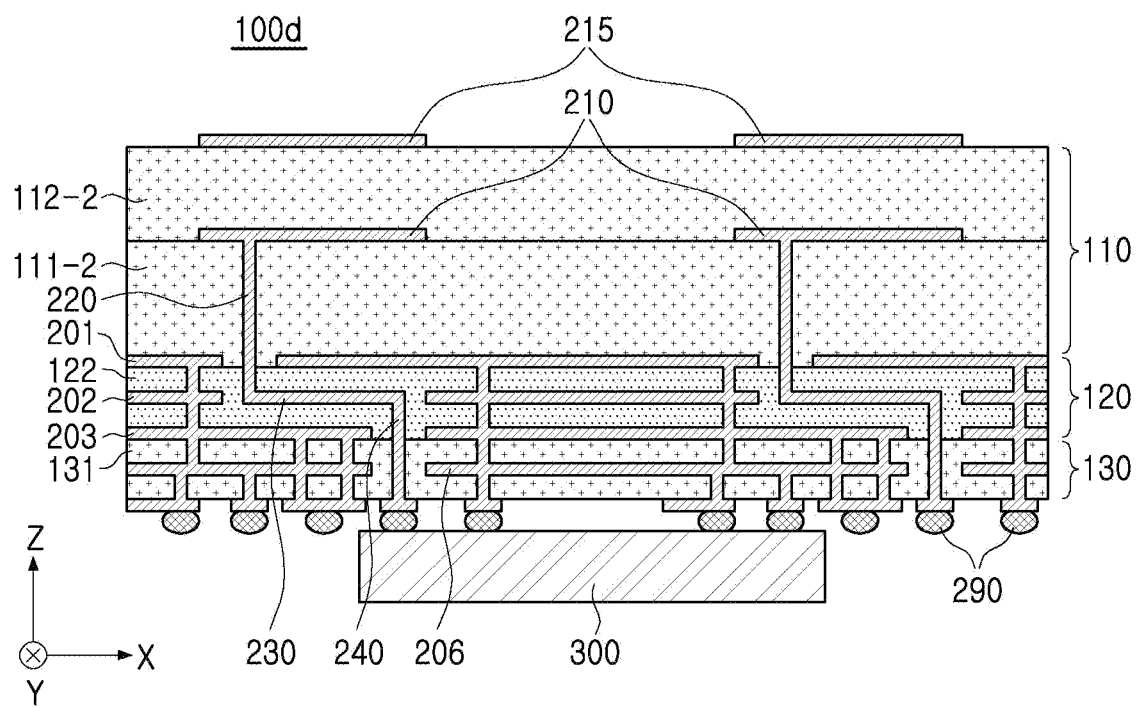

Referring to FIGS. 1B, 1C, and 1D, in example embodiments, a dielectric constant of the second antenna insulating layer 112-2 of the radio frequency modules 100*b*, 100*c*, and 100*d* may be higher than a dielectric constant of the feed-line insulating layer 122.

Referring to FIG. 1D, in example embodiments, dielectric constants of the first and second antenna insulating layers 111-1 and 112-1 of the radio frequency module 100*d* may be the same.

Figure 1E:
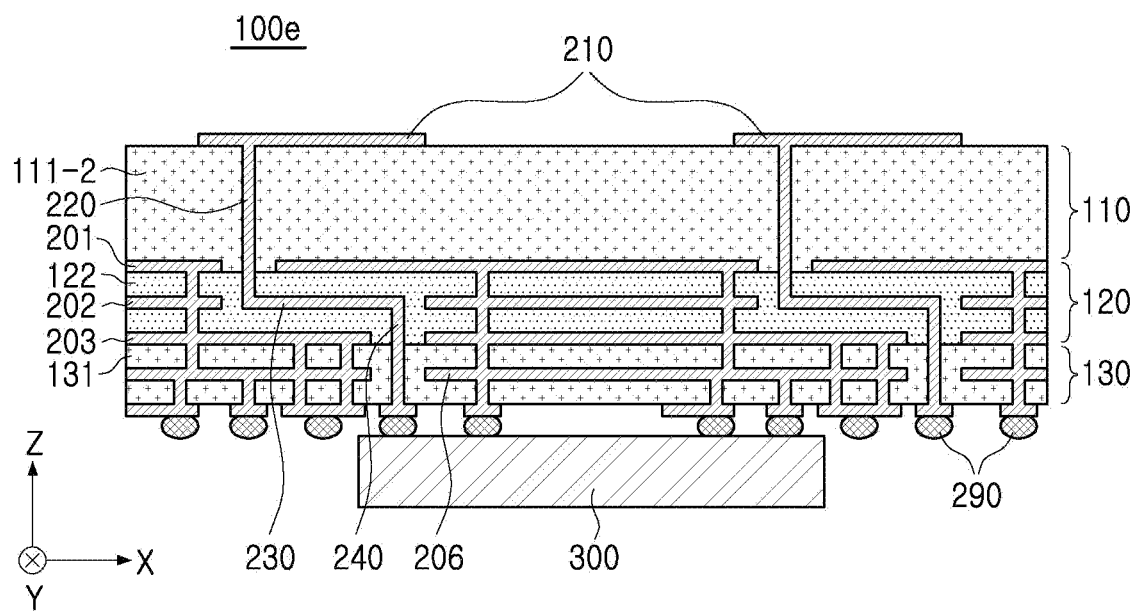

Referring to FIG. 1E, in example embodiments, in the radio frequency module 100*e*, the second patch antenna pattern and the second antenna dielectric layer may not be provided.

Figure 2A:
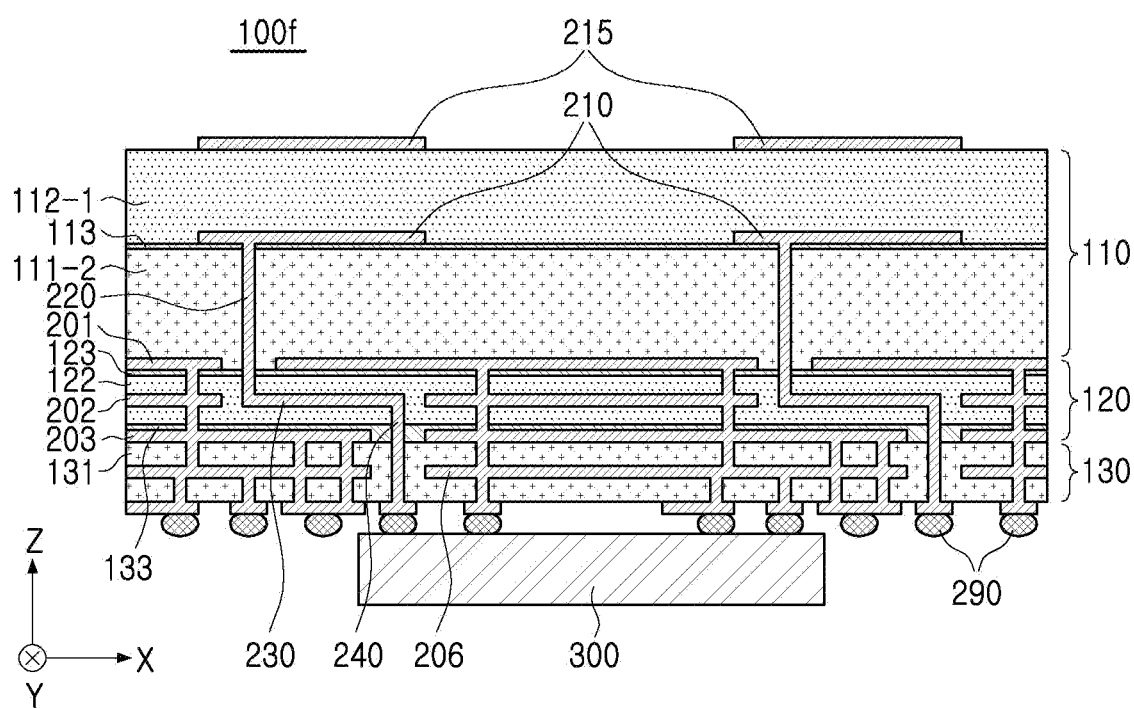
FIGS. 2A and 2B are lateral views illustrating a radio frequency module further including an insulating adhesive layer according to one or more example embodiments of the present disclosure.
Figure 2B:
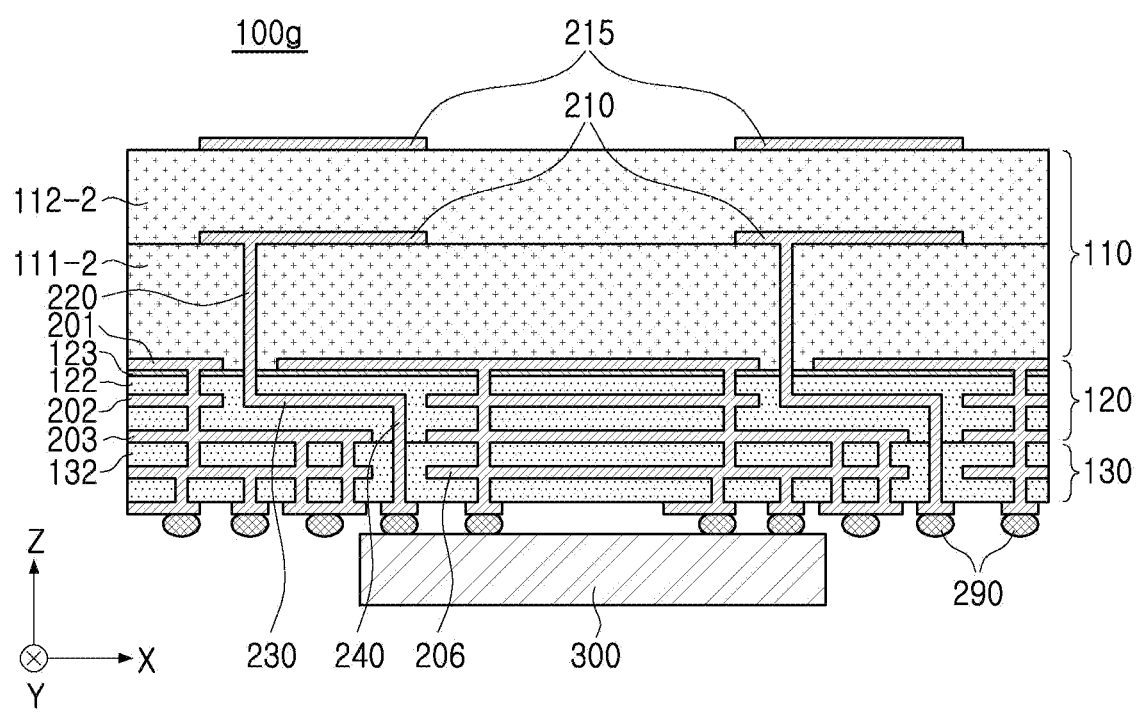

FIGS. 2A and 2B are lateral views illustrating a radio frequency module further including an insulating adhesive layer according to an example embodiment.

Referring to FIG. 2A, a radio frequency module 100*f* in the example embodiment may further include at least one of a first insulating adhesive layer 133, a second insulating adhesive layer 123, and an antenna insulating adhesive layer 113.

The first and second insulating adhesive layers 133 and 123 may be configured to be in contact with a lower surface and an upper surface of a feed-line insulating layer 122. For example, the first and second insulating adhesive layers 133 and 123 may include a material (e.g., polymer) having adhesiveness stronger than that of a material (e.g., prepreg) of the feed-line insulating layer 122 or that of a material (e.g., ceramic) of the first antenna insulating layer 111-2, and may have a thickness less than a thickness of the feed-line insulating layer 122.

Warpage strength caused by the increased number of total insulating layers of a radio frequency module 100*f* in the example embodiment may be alleviated by the first and second insulating adhesive layers 133 and 123.

Accordingly, in the radio frequency module 100f, likelihood of warpage may be reduced without solder-bonding between the insulating layers. The solder may have a melting point (e.g., a melting point of tin or tin alloys) lower than a melting point (e.g., a melting point of copper) of the feed via.

The second insulating adhesive layer 123 may be configured such that solder having a melting point lower than a melting point of the feed via 220 may not be disposed between the first antenna insulating layer 111-2 and the feed-line insulating layer 122. For example, the second insulating adhesive layer 123 may be configured to provide a dispositional space free of solder having a melting point lower than a melting point of the feed via 220 between the first antenna insulating layer 111-2 and the feed-line insulating layer 122. For example, the second insulating adhesive layer 123 may completely fill a portion of a space between the first antenna insulating layer 111-2 and the feed-line insulating layer 122 in which a conductive structure is not disposed.

The first insulating adhesive layer 133 may be in contact with the at least one IC insulating layer 131 and the feed-line insulating layer 122 between the at least one IC insulating layer 131 and the feed-line insulating layer 122.

Accordingly, likelihood of warpage of overall layers of the at least one IC insulating layer 131 and the feed-line insulating layer 122 may decrease, and overall reliability (e.g., likelihood of shorts between wirings) of the feeding unit 120 and the IC support unit 130 may improve such that compactness of the at least one IC wiring layer 206 may easily increase.

Accordingly, in the example embodiment, likelihood of warpage of layers of the radio frequency module 100f and an overall size of the radio frequency module 100f may decrease.

The second insulating adhesive layer 123 may be in contact with the first antenna insulating layer 111-2 and the feed-line insulating layer 122 between the first antenna insulating layer 111-2 and the feed-line insulating layer 122.

Accordingly, even when the radio frequency module 100f has an increased thickness by additionally stacking the antenna unit 110, likelihood of warpage of overall layers of the radio frequency module 100f may decrease.

The antenna insulating adhesive layer 113 may be in contact with the first and second antenna insulating layers 111-2 and 112-1 between the first and second antenna insulating layers 111-2 and 112-1.

Accordingly, in the example embodiment, even when the radio frequency module 100f has an increased thickness by additionally stacking the second antenna insulating layer 112-1, likelihood of warpage of overall layers of the radio frequency module 100f may decrease.

Referring to FIG. 2B, in a radio frequency module 100g in the example embodiment, the first insulating adhesive layer and the antenna insulating adhesive layer may not be provided, and a dielectric constant of the feed-line insulating layer 122 may be the same as a dielectric constant of at least one IC insulating layer 132.

Accordingly, in the radio frequency module 100g in the example embodiment, even though a dielectric constant of the feed-line insulating layer 122 is the same as a dielectric constant of at least one IC insulating layer 132, likelihood of warpage of layers may decrease due to a second insulating adhesive layer 123.

FIGS. 3A to 3F are plan views illustrating a radio frequency module in different positions in a z direction according to an example embodiment.

Figure 3A:
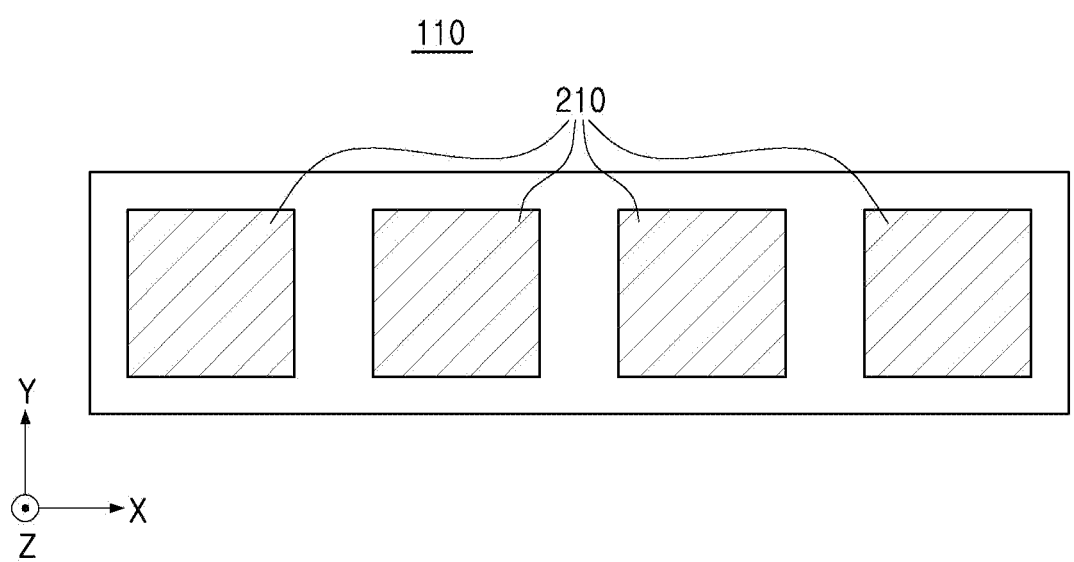
FIGS. 3A to 3F are plan views illustrating a radio frequency module in different positions in a z direction according to one or more example embodiments of the present disclosure.

Referring to FIG. 3A, in an antenna unit 110, a plurality of first patch antenna patterns 210 each having a polygonal shape may be arranged side by side in the x direction.

Figure 3B:
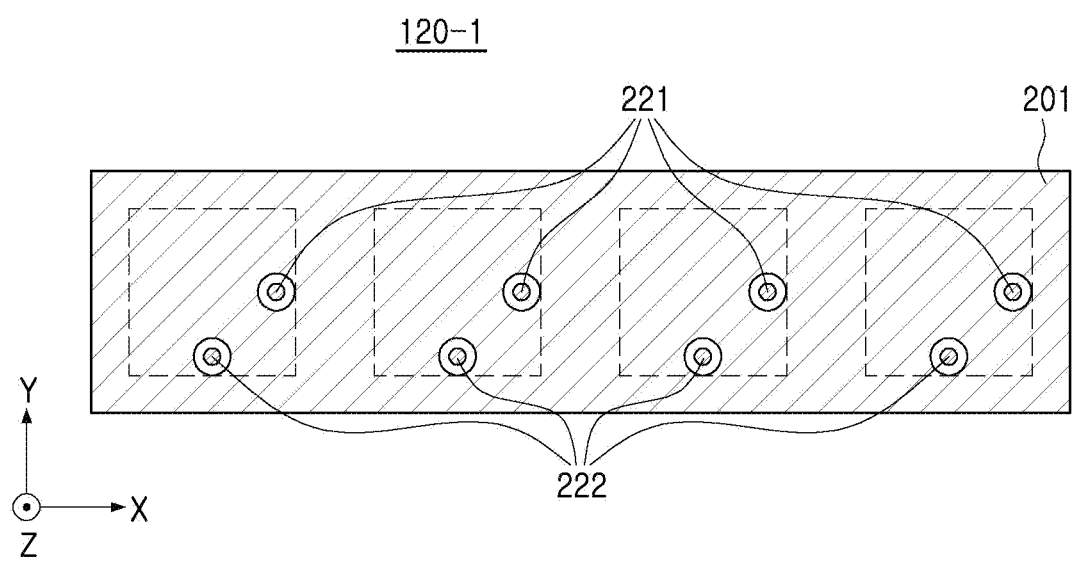

Referring to FIG. 3B, a first conductive layer 120-1 of a feeding unit may include a first ground layer 201 having a through-hole through which a plurality of feed vias 221 and 222 penetrate.

Figure 3C:
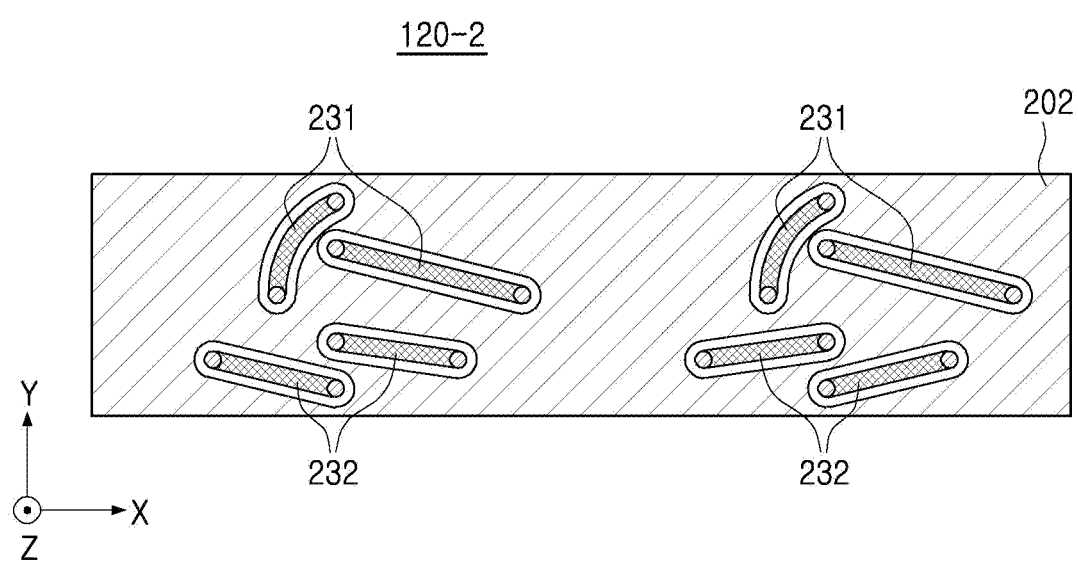

Referring to FIG. 3C, a second conductive layer 120-2 of a feeding unit may include a second ground layer 202 surrounding each of a plurality of feed lines 231 and 232.

Figure 3D:
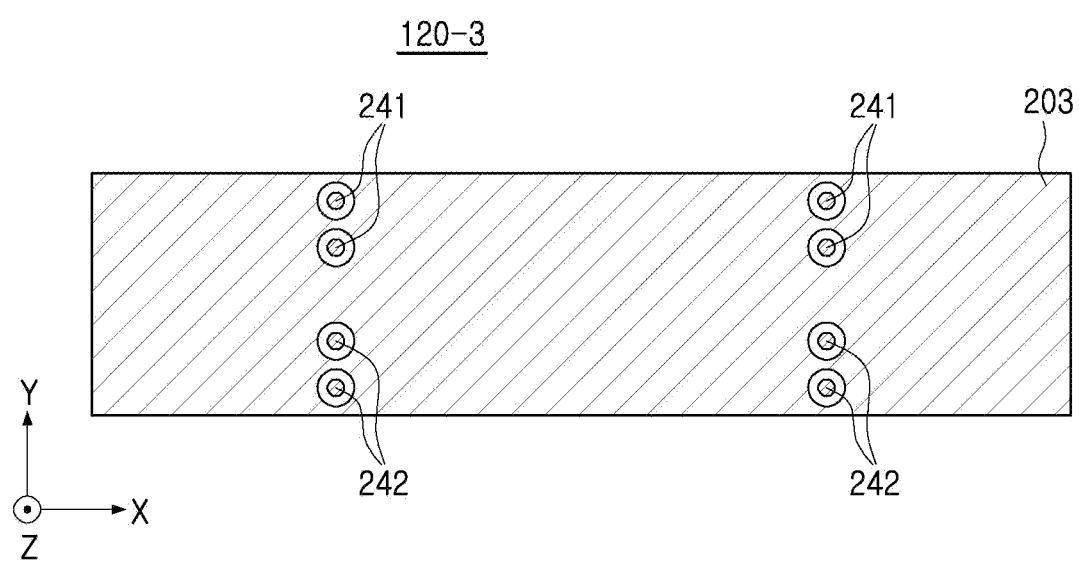

Referring to FIG. 3D, a third conductive layer 120-3 of the feeding unit may include a third ground layer 203 having a through-hole through which a plurality of wiring vias 241 and 242 penetrate.

Figure 3E:
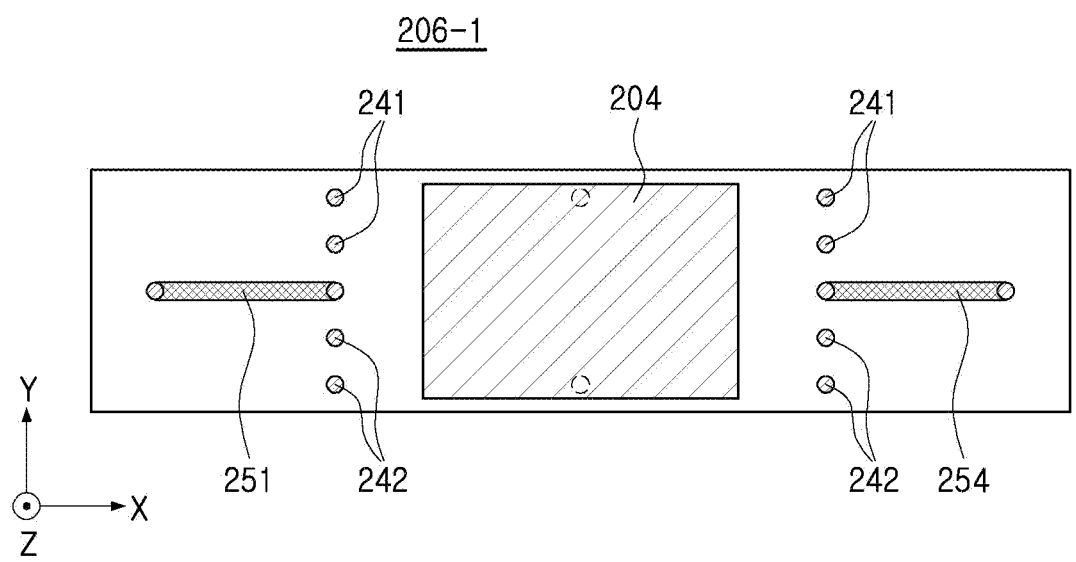

Referring to FIG. 3E, a first IC wiring layer 206-1 of an IC support unit may include a base signal line 251 and a power line 254, and may further include a fourth ground layer 204.

The base signal line 251 may provide a transmission path of a base signal.

The power line 254 may provide a transfer path of power for an RFIC.

The fourth ground layer 204 may be electrically connected to the RFIC, and may correspond to a conductive structure for improving performance of processing (e.g., amplification, frequency conversion, filtering, a phase control, or the like) performed by the RFIC 300.

Figure 3F:
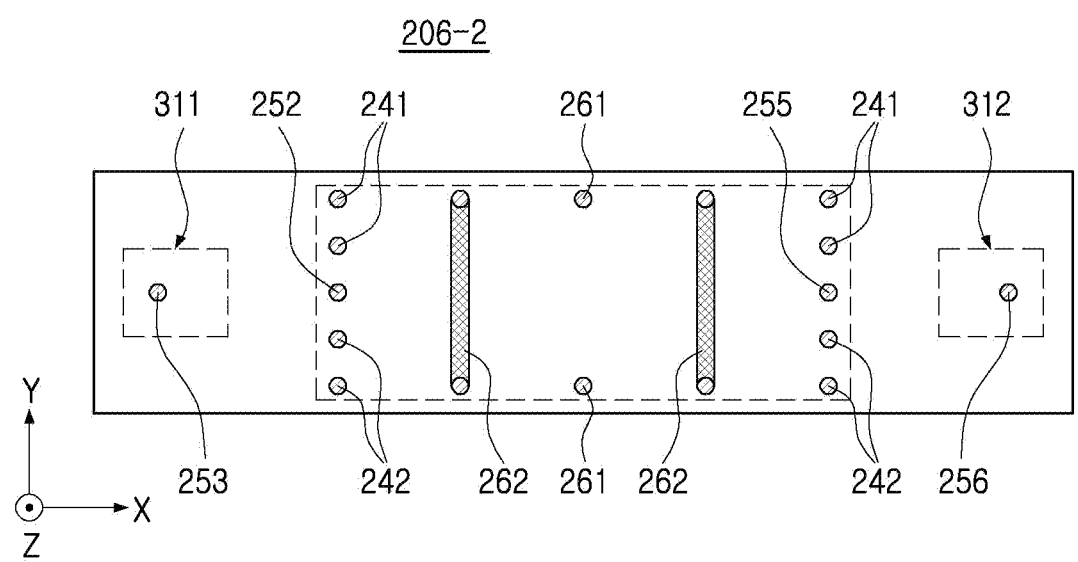

Referring to FIG. 3F, a second IC wiring layer 206-2 of the IC support unit may include first and second base signal vias 252 and 253 and first and second power vias 255 and 256, and may further include an IC support via 261 and an IC support wiring 262.

The first and second base signal vias 252 and 253 may be electrically connected to the RFIC and a first external entity 311 (e.g., a base substrate), respectively, and the first and second power vias 255 and 256 may be electrically connected to the RFIC and a second external entity 312 (e.g., power management integrated circuit), respectively.

The IC support via 261 and the IC support wiring 262 may be electrically connected to the RFIC and/or the fourth ground layer, and may correspond to a conductive structure for improving performance of processing performed by the RFIC 300.

Figure 4:
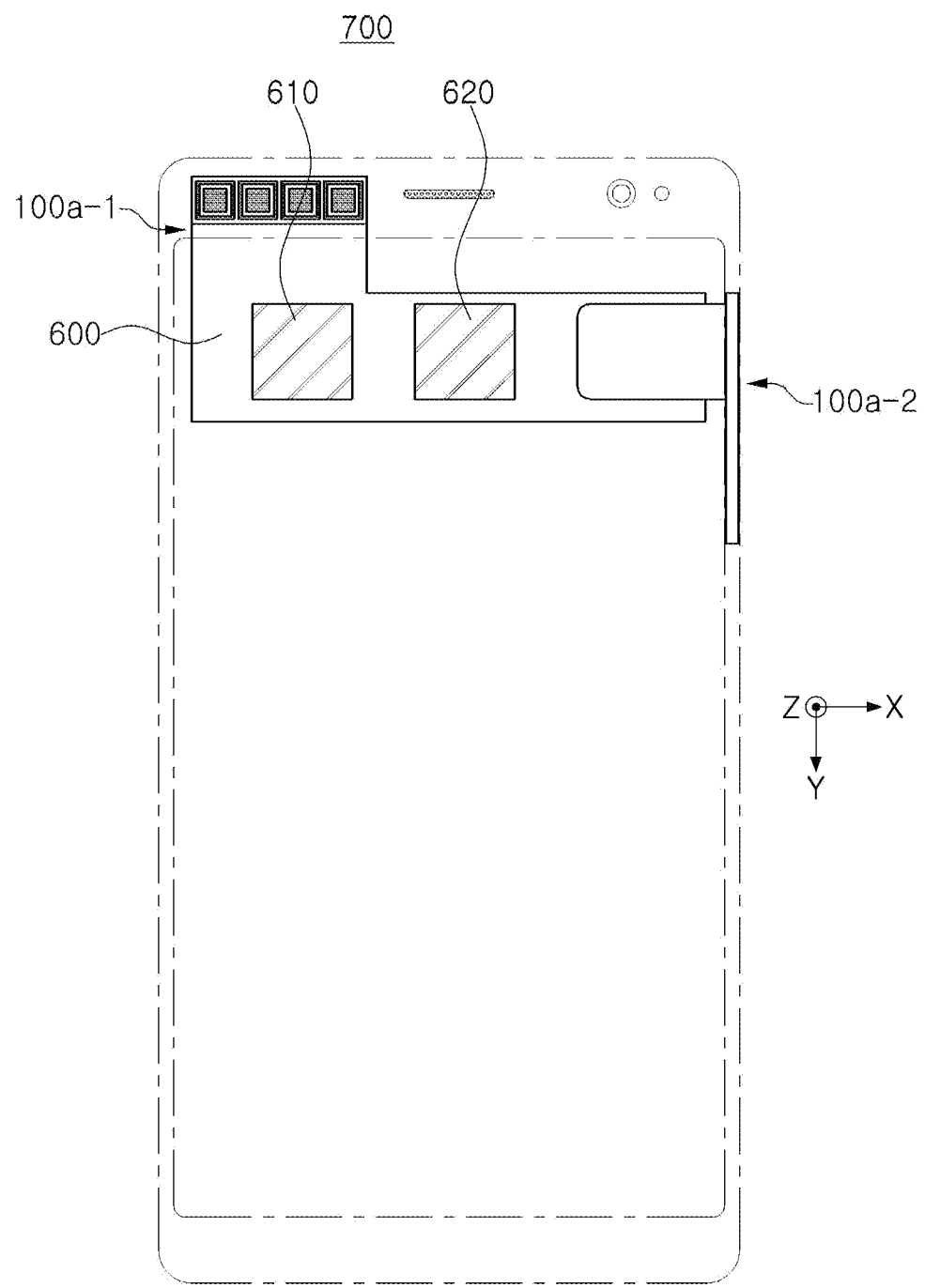
FIG. 4 is a plan view illustrating a radio frequency module disposed in an electronic device according to one or more example embodiments of the present disclosure.

FIG. 4 is a plan view illustrating a radio frequency module disposed in an electronic device according to an example embodiment.

Referring to FIG. 4, radio frequency modules 100a-1 and 100a-2 in the example embodiment may be disposed adjacent to a plurality of different edges of an electronic device 700, respectively.

The electronic device 700 may be implemented by a smartphone, a personal digital assistant, a digital video camera, a digital still camera, a network system, a computer, a monitor, a tablet personal computer (PC), a laptop PC, a netbook PC, a television, a video game, a smart watch, an automotive component, or the like, but an example of the electronic device 700 is not limited thereto.

The electronic device 700 may include a base substrate 600, and the base substrate 600 may further include a communications modem 610 and a baseband IC 620.

The communications modem 610 may include at least some of a memory chip such as a volatile memory (e.g., a dynamic random access memory (DRAM)), a non-volatile memory (e.g., a read only memory (ROM)), a flash memory, or the like; an application processor chip such as a central processor (e.g., a central processing unit (CPU)), a graphics processor (e.g., a graphics processing unit (GPU)), a digital signal processor, a cryptographic processor, a microprocessor, a microcontroller, or the like; and a logic chip such as an analog-to-digital converter, an application-specific integrated circuit (ASIC), or the like.

The baseband IC 620 may generate a base signal by performing analog-to-digital conversion, and amplification, filtering, and frequency conversion on an analog signal. A base signal input to and output from the baseband IC 620 may be transferred to the radio frequency modules 100*a*-1 and 100*a*-2 through a coaxial cable, and the coaxial cable may be electrically connected to an electrical connector structure of the radio frequency modules 100*a*-1 and 100*a*-2.

For example, a frequency of the base signal may be a baseband, and may be a frequency (e.g., several GHzs) corresponding to an intermediate frequency (IF). A frequency (e.g., 28 GHz or 39 GHz) of an RF signal may be higher than an IF, and may correspond to a millimeter wave (mmWave).

The wiring layers, the vias, the lines, and the patterns described in the aforementioned example embodiments may include a metal material (e.g., a conductive material such as copper (Cu), aluminum (Al), silver (Ag), tin (Sn), gold (Au), nickel (Ni), lead (Pb), titanium (Ti), or alloys thereof), and may be formed by a plating method such as a chemical vapor deposition (CVD) method, a physical vapor deposition (PVD) method, a sputtering method, a subtractive method, an additive method, a semi-additive process (SAP), a modified semi-additive process (MSAP), or the like, but examples of the material and the method are not limited thereto.

The insulating layer in the example embodiments may be implemented by prepreg, FR4, a thermosetting resin such as epoxy resin, a thermoplastic resin, a resin in which the above-described resin is impregnated in a core material, such as a glass fiber (or a glass cloth or a glass fabric), together with an inorganic filler, an Ajinomoto build-up film (ABF), bismaleimide triazine (BT), a photoimagable dielectric (PID) resin, a general copper clad laminate (CCL), or a ceramic-based insulating material, or the like.

The RF signal described in the example embodiments may include protocols such as wireless fidelity (W-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols, but an example embodiment thereof is not limited thereto. Also, a frequency (e.g., 24 GHz, 28 GHz, 36 GHz, 39 GHz, or 60 GHz) of the RF signal may be higher than a frequency of an IF signal (e.g., 2 GHz, 5 GHz, 10 GHz, or the like).

According to the aforementioned example embodiments, the radio frequency module may reduce transmission loss of an RF signal and may support the improvement of performance of the RFIC, and/or may have a reduced size.

Also, the radio frequency module may support the improvement of performance of an antenna or may support the improvement of performance of the RFIC, and may prevent warpage of the plurality of insulating layers.

While specific examples have been shown and described above, it will be apparent after an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency module, comprising:
   a radio frequency integrated circuit (RFIC) configured to input or output a base signal and a radio frequency (RF) signal comprising a frequency higher than a frequency of the base signal;
   a wiring via extending from the RFIC in an upward direction and configured to provide a transmission path of the RF signal;
   a feed line electrically connected to the wiring via and configured to provide the transmission path of the RF signal;
   a second ground layer surrounding the feed line;
   a first ground layer spaced apart from the second ground layer in an upward direction;
   a third ground layer disposed between the second ground layer and the RFIC;
   a feed-line insulating layer disposed between the first and the third ground layers;
   at least one IC wiring layer disposed between the third ground layer and the RFIC, electrically connected to the RFIC, and comprising at least one portion configured to provide a transmission path of the base signal; and
   at least one IC insulating layer disposed between the third ground layer and the RFIC,
   wherein a dielectric constant of the at least one IC insulating layer is higher than a dielectric constant of the feed-line insulating layer.

2. The radio frequency module of claim 1, wherein the at least one IC wiring layer further comprises a power line configured to provide a transfer path of power for the RFIC, and
   wherein the at least one portion comprises a base signal line configured to provide the transmission path of the base signal.

3. The radio frequency module of claim 1, wherein the at least one IC wiring layer further comprises a fourth ground layer electrically connected to the RFIC, and
   wherein the at least one portion comprises a base signal line configured to provide the transmission path of the base signal.

4. The radio frequency module of claim 1, further comprising:

a first patch antenna pattern spaced apart from the first ground layer in an upward direction;

a feed via electrically connected to the feed line and configured to provide a feeding path with respect to the first patch antenna pattern; and a first antenna insulating layer disposed between the first ground layer and the first patch antenna pattern.

5. The radio frequency module of claim 4, wherein a dielectric constant of the feed-line insulating layer is lower than a dielectric constant of the first antenna insulating layer.

6. The radio frequency module of claim 4, further comprising:

a second patch antenna pattern spaced apart from the first patch antenna pattern in an upward direction; and a second antenna insulating layer disposed between the first and the second patch antenna patterns.

7. The radio frequency module of claim 6, wherein a dielectric constant of the first antenna insulating layer is higher than a dielectric constant of the feed-line insulating layer, and is higher than a dielectric constant of the second antenna insulating layer.

8. The radio frequency module of claim 7, further comprising:

an antenna insulating adhesive layer in contact with the first and the second antenna insulating layers between the first and the second antenna insulating layers.

9. The radio frequency module of claim 1, further comprising:

an insulating adhesive layer in contact with the at least one IC insulating layer and the feed-line insulating layer between the at least one IC insulating layer and the feed-line insulating layer.

10. An electronic device comprising:

a plurality of different edges;

the radio frequency module of claim 1 disposed adjacent to an edge of the plurality of edges;

a communications modem; and a baseband integrated circuit (IC) configured to generate the base signal and transfer the base signal input to and output from the baseband IC to the radio frequency module.

11. The electronic device of claim 10, wherein the electronic device is a smart phone, a personal digital assistant, a digital video camera, a digital still camera, a network system, a computer, a monitor, a tablet personal computer (PC), a laptop PC, a netbook PC, a television, a video game, a smart watch, or an automotive component.

12. A radio frequency module, comprising:

a radio frequency integrated circuit (RFIC) configured to input or output a base signal and a radio frequency (RF) signal comprising a frequency higher than a frequency of the base signal;

a wiring via extending from the RFIC in an upward direction and configured to provide a transmission path of the RF signal;

a feed line electrically connected to the wiring via and configured to provide the transmission path of the RF signal;

a second ground layer surrounding the feed line;

a first ground layer spaced apart from the second ground layer in an upward direction;

a third ground layer disposed between the second ground layer and the RFIC;

a feed-line insulating layer disposed between the first and the third ground layers;

at least one IC wiring layer disposed between the third ground layer and the RFIC, electrically connected to the RFIC, and comprising at least one portion configured to provide a transmission path of the base signal;

at least one IC insulating layer disposed between the third ground layer and the RFIC; and one or more of a first insulating adhesive layer in contact with a lower surface of the feed-line insulating layer and a second insulating adhesive layer in contact with an upper surface of the feed-line insulating layer, wherein a dielectric constant of the at least one IC insulating layer is higher than a dielectric constant of the feed-line insulating layer.

13. The radio frequency module of claim 12, wherein the first insulating adhesive layer is disposed in contact with the at least one IC insulating layer and the feed-line insulating layer between the at least one IC insulating layer and the feed-line insulating layer.

14. The radio frequency module of claim 13, wherein the at least one IC wiring layer further comprises a power line configured to provide a transfer path of power for the RFIC, and wherein the at least one portion comprises a base signal line configured to provide the transmission path of the base signal.

15. The radio frequency module of claim 13, wherein the at least one IC wiring layer further comprises a fourth ground layer electrically connected to the RFIC, and wherein the at least one portion comprises a base signal line configured to provide the transmission path of the base signal.

16. The radio frequency module of claim 12, further comprising:

a first patch antenna pattern spaced apart from the first ground layer in an upward direction;

a feed via electrically connected to the feed line and configured to provide a feeding path with respect to the first patch antenna pattern; and a first antenna insulating layer disposed between the first ground layer and the first patch antenna pattern, wherein the second insulating adhesive layer is disposed in contact with the first antenna insulating layer and the feed-line insulating layer between the first antenna insulating layer and the feed-line insulating layer.

17. The radio frequency module of claim 16, further comprising:

a second patch antenna pattern spaced apart from the first patch antenna pattern in an upward direction;

a second antenna insulating layer disposed between the first and the second patch antenna patterns; and an antenna insulating adhesive layer in contact with the first and the second antenna insulating layers between the first and the second antenna insulating layers.

18. The radio frequency module of claim 16, wherein the second insulating adhesive layer is configured to provide a dispositional space free of solder comprising a melting point lower than a melting point of the feed via between the first antenna insulating layer and the feed-line insulating layer.

19. An electronic device comprising:

a plurality of different edges;

the radio frequency module of claim 12 disposed adjacent to an edge of the plurality of edges;

a communications modem; and a baseband integrated circuit (IC) configured to generate the base signal and transfer the base signal input to and output from the baseband IC to the radio frequency module.

20. The electronic device of claim 19, wherein the electronic device is a smart phone, a personal digital assistant, a digital video camera, a digital still camera, a network system, a computer, a monitor, a tablet personal computer (PC), a laptop PC, a netbook PC, a television, a video game, a smart watch, or an automotive component.

\* \* \* \* \*